US009008229B2

(12) United States Patent
Li

(10) Patent No.: US 9,008,229 B2
(45) Date of Patent: Apr. 14, 2015

(54) DEVICE AND A METHOD FOR OBTAINING A RADIO CONTROLLED CLOCK SIGNAL

(75) Inventor: Zhen Li, Beijing (CN)

(73) Assignee: Beijing KT Micro, Ltd., Beijing (CN)

( * ) Notice: Subject to any disclaimer, the term of this patent is extended or adjusted under 35 U.S.C. 154(b) by 615 days.

(21) Appl. No.: 13/250,589

(22) Filed: Sep. 30, 2011

(65) Prior Publication Data

US 2012/0170687 A1 Jul. 5, 2012

(30) Foreign Application Priority Data

Dec. 31, 2010 (CN) .......................... 2010 1 0624072

(51) Int. Cl.
*H03D 1/24* (2006.01)
*G04R 20/10* (2013.01)

(52) U.S. Cl.
CPC ...................................... *G04R 20/10* (2013.01)

(58) Field of Classification Search
CPC ................................ H04L 27/34; H04L 27/06
USPC ........... 375/320, 371, 324, 343, 349; 370/204
See application file for complete search history.

(56) References Cited

U.S. PATENT DOCUMENTS

2007/0165747 A1* 7/2007 May et al. ..................... 375/316
2008/0031126 A1* 2/2008 Feher ............................ 370/204
2008/0095290 A1* 4/2008 Leung ........................... 375/371
2011/0274021 A1* 11/2011 He et al. ........................ 370/311
2012/0314754 A1* 12/2012 Haran et al. .................. 375/232

FOREIGN PATENT DOCUMENTS

CN 1711746 A 12/2005
CN 101425809 A 5/2009
CN 202013492 U 10/2011

* cited by examiner

*Primary Examiner* — Daniel Washburn
*Assistant Examiner* — Eboni Hughes
(74) *Attorney, Agent, or Firm* — J.C. Patents

(57) ABSTRACT

A device for obtaining a RCC signal and related methods are described herein improves the reliability of the RCC signal reception and demodulation. In one aspect, a device configured to obtain a RCC signal includes: a receiving circuit to receive an analog AM RCC signal and to process said analog AM RCC signal to generate a digital AM RCC signal; and a demodulation circuit in connection with said receiving circuit, to demodulate said digital AM RCC signal to generate the RCC signal. In another aspect, a method for obtaining a RCC signal includes: processing a received analog AM RCC signal to generate a digital AM RCC signal; and demodulating said digital AM RCC signal to generate said RCC signal. Since the digital processing method is more reliable than the analog processing method, the reliability of RCC signal reception and demodulation are improved.

4 Claims, 5 Drawing Sheets

DEVICE AND A METHOD FOR OBTAINING A RADIO CONTROLLED CLOCK SIGNAL

RELATED APPLICATIONS INFORMATION

The application claims priority under 35 U.S.C. 119 (a) to Chinese application number 201010624072.5 filed on Dec. 31, 2010, which is incorporated herein by reference in its entirety as if set forth in full.

BACKGROUND

1. Technical Field

The embodiments described herein relate to microelectronics field, and more particularly, to a device and a method for obtaining a radio controlled clock signal.

2. Related Art

With the development of science and technology, radio wave based time correction technology emerged. The radio wave based time correction technology refers to a technique that corrects time by adopting a Radio Controlled Clock (RCC) signal. The RCC signal carries time information including the year, the month, the day, the minute and the second. Since the time information carried in the RCC signal is very accurate, the time would be very accurate after being corrected by the radio wave based time correction technology. Different countries have adopted different timing coding methods and transmission carrier frequencies for RCC signal. For example, In China, the time coding method is BPC based coding and the transmission carrier frequency is 68.5 kHz.

With increased consumer demands, the radio wave based time correction technology becomes popular even for an ordinary radio. The RCC signal is obtained via an analog receiving and demodulating method in the ordinary radio. However, the analog receiving and demodulating method is less reliable.

SUMMARY

A device and a method for obtaining a RCC signal described herein improve the reliability of the RCC signal reception and demodulation.

In one aspect, a device configured to obtain a RCC signal includes: a receiving circuit to receive an analog amplitude modulation (AM) RCC signal and to process said analog AM RCC signal to generate a digital AM RCC signal; and a demodulation circuit in connection with said receiving circuit, to demodulate said digital AM RCC signal to generate the RCC signal;

where the receiving circuit includes:

an antenna;

an analog quadrature mixing circuit configured to connect with the antenna, where said output of the analog quadrature mixing circuit including a first output branch and a second output branch;

a quadrature local oscillator circuit configured to connect with said analog quadrature mixing circuit;

a first analog low-pass filter configured to connect with said first output branch;

a second analog low pass filter configured to connected with said second output branch:

a first analog to digital converter configured to connect with said first analog low-pass filter; a second analog to digital converter configured to connect with said second analog low-pass filter;

a digital quadrature mixing circuit configured to connect with said first analog to digital converter and said second analog-to digital-converter, where the output of said digital quadrature mixing circuit including a third output branch and a fourth output branch;

a quadrature digital local oscillator circuit configured to connect with said digital quadrature mixing circuit;

a first digital low pass filter configured to connect with said third output branch at one end and to connect with said demodulation circuit at the other end;

a second digital low pass filter configured to connect with said fourth output branch at one end and to connect with said demodulation circuit at the other end.

In another aspect, a method for obtaining a RCC signal includes: processing a received analog AM RCC signal to generate a digital AM RCC signal; and demodulating said digital AM RCC signal to generate said RCC signal where the step of processing received analog AM RCC signal to generate a digital AM RCC signal includes:

processing the analog AM RCC signal through analog quadrature mixing and low pass filtering, digitalizing the analog AM RCC signal, and processing the AM RCC signal through digital quadrature mixing and low pass filtering, to generate a digital AM RCC signal.

The received analog AM RCC signal may be processed to generate a digital AM RCC signal, the digital AM RCC signal may then be demodulated to generate the RCC signal based on a digital processing method. Since the digital processing method is more reliable than the analog processing method, the reliability of the RCC signal reception and demodulation are improved.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 1:
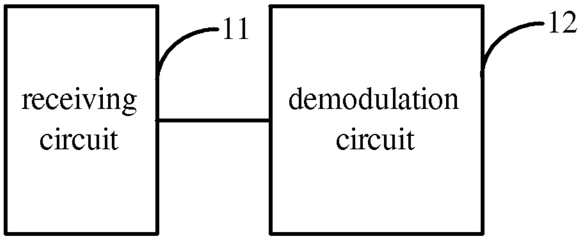
FIG. 1 is a structure diagram showing a device configured to obtain a RCC signal according to a first embodiment.

Referring now to the drawings, a description will be made herein of embodiments herein.

FIG. 1 is a structure diagram showing a device configured to obtain a RCC signal according to a first embodiment. The device may include a receiving circuit 11 and a demodulation circuit 12, and the demodulation circuit 12 may be configured to connect with the receiving circuit 11.

In particular, the receiving circuit 11 may be configured to receive an analog AM RCC signal, and to process the analog AM RCC signal to generate a digital AM RCC signal. The demodulation circuit 12 may be configured to demodulate the digital AM RCC signal to generate a RCC signal.

In this embodiment, the receiving circuit 11 may process the received analog AM RCC signal to generate a digital AM RCC signal, the demodulation circuit 12 may demodulate the digital AM RCC signal to generate a RCC signal, resulting in the generation of the RCC signal by a digital processing method. Because the digital processing method is more reliable than the analog processing method, reliability of the RCC signal reception and demodulation is improved.

Figure 2:
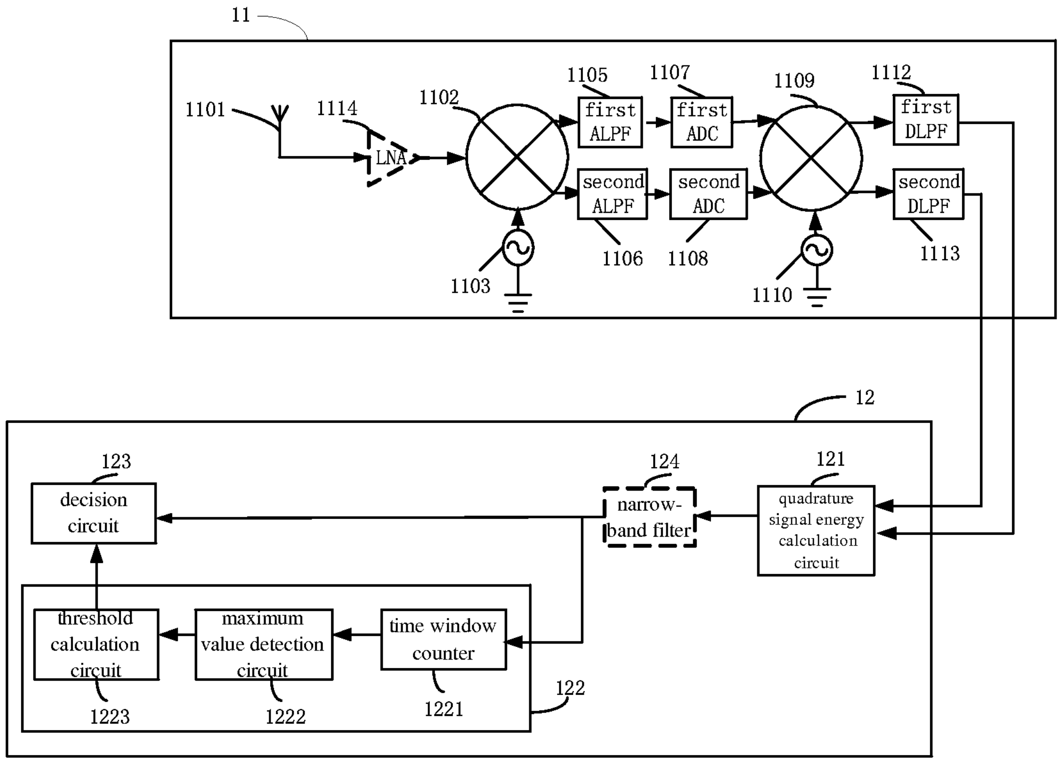
FIG. 2 is a structure diagram showing a device configured to obtain a RCC signal according to a second embodiment.

FIG. 2 is a structure diagram showing a device configured to obtain a RCC signal according to a second embodiment. On the basis of the structure diagram illustrated in FIG. 1, the digital AM RCC signal may be a base band signal, the receiving circuit 11 may include an antenna 1101, an analog quadrature mixing circuit 1102, an analog local oscillator circuit 1103, a first analog low pass filter (ALPF) 1105, a second ALPF 1106, a first Analog-to-Digital Converter (ADC) 1107, a second ADC 1108, a digital quadrature mixing circuit 1109, a digital local oscillator circuit 1110, a first digital low pass filter (DLPF) 1112, a second DLPF 1113.

In particular, the analog quadrature mixing circuit 1102 may be configured to connect to the antenna 1101. The analog quadrature mixing circuit 1102 may include a first output branch and a second output branch; the analog local oscillator circuit 1103 may be configured to connect to the analog quadrature mixing circuit 1102; the first ALPF 1105 may be configured to connect to the first output branch; the second ALPF 1106 may be configured to connect to the second output branch; the first ADC 1107 may be configured to connect to the first ALPF 1105; The second ADC 1108 may be configured to connect to the second ALPF 1106; the digital quadrature mixing circuit 1109 may be configured to connect to both the first ADC 1107 and the second ADC 1108, the digital quadrature mixing circuit 1109 may include a third output branch and a fourth output branch; the digital local oscillator circuit 1110 may be configured to connect to the digital quadrature mixing circuit 1109; one end of the first DLPF 1112 may be configured to connect to the third output branch, the other end of the first DLPF 1112 may be configured to connect to the demodulation circuit 12; one end of the second DLPF 1113 may be configured to connect to the fourth output branch, and the other end of the second DLPF 1113 may be configured to connect to the demodulation circuit 12.

In another embodiment, in order to filter out noise and improve the performance of the receiving circuit 11, the receiving circuit 11 may also include a low-noise amplifier (LNA) 1114, and the LNA 1114 may be configured to connect between the antenna 1101 and the analog quadrature mixing circuit 1102.

In the receiving circuit 11, the LNA 1114 may be configured to amplify the analog AM RCC signal received by the antenna 1101 and to output the signal to the analog quadrature mixing circuit 1102. The analog local oscillator 1103 may be configured to generate two analog local oscillator signals with a phase difference of 90°. The analog quadrature mixing circuit 1102 may be configured to mix the amplified analog AM RCC signal with the two local oscillator signals respectively, and then output the mixed signals to the first ALPF 1105 and the second ALPF 1105 via the first output branch and the second output branch respectively, one mixed signal may pass through the first ALPF 1105 and be outputted to the first ADC 1107 to generate a digital intermediate frequency (IF) signal, and the center frequency of the digital IF signal is $F_{IF}$. The other mixed signal may pass through the second ALPF 1106 and then be outputted to the second ADC 1108 to generate another digital IF signal, the center frequency of the digital IF signal is $F_{IF}$. Both digital IF signals may be outputted to the digital quadrature mixing circuit 1109. The digital local oscillator 1110 may be configured to generate two digital local oscillator signals, the frequency of the two digital local oscillator signals is $F_{IF}$ with a phase difference of 90°. The digital quadrature mixing circuit 1109 may be configured to mix the two digital IF signals with the two digital local oscillator signals respectively and to output the two mixed signals to the first DLPA 1112 and the second DLPA 1113 via the third output branch and the forth output branch respectively. The digital signal obtained after the first DLPA 1112 is the I channel of the digital quadrature AM RCC signal. The digital signal obtained after the second DLPA 1113 is the Q channel of the digital quadrature AM RCC signal. The digital quadrature AM RCC signal is a base band signal to be outputted to the demodulation circuit 12.

In one embodiment, the receiving circuit 11 may only include the antenna 1101, the analog quadrature mixing circuit 1102, the analog local oscillator circuit 1103, the first ALPA 1105, the second ALPA 1106, the first ADC 1107, the second ADC 1108.

In one embodiment, the receiving circuit 11 may include an antenna, at least one local oscillator circuit, at least one mixing circuit in cascade connection, at least two low-pass filters and at least one analog to digital converter. The at least one local oscillator circuit may include at least one quadrature local oscillator, at least one mixing circuit configured to be in connection with an antenna and at least one local oscillator circuit, the at least one mixing circuit may include at least one quadrature mixing circuit, at least one quadrature local oscillator circuit may be configured to connect with the corresponding at least one quadrature mixing circuit; the mixing circuit output for each output branch may be configured to connect to a low-pass filter; any mixing circuit input or output for each output branch connection may be configured to connect with a ADC.

In this embodiment, the demodulation circuit 12 may include a quadrature signal energy calculation circuit 121, a threshold detection circuit 122 and a decision circuit 123.

The quadrature signal energy calculation circuit 121 may be configured to connect to the first DLPF 1112 and the second DLPF 1113; the threshold detection circuit 122 may be configured to connect with the quadrature signal energy calculation circuit 121; the decision circuit 123 may be configured to connect with both the threshold detection circuit 122 and the quadrature signal energy calculation circuit 121.

In one embodiment, in order to improve the performance of demodulation circuit 12, the demodulation circuit 12 may also include a narrow-band filter 124, one end of the narrow-band filter 124 may be configured to connect with the quadrature signal energy calculation circuit 121, the other end of the narrow-band filter 124 may be configured to connected with the threshold detection circuit 122 and the decision circuit 123.

In this embodiment, the quadrature signal energy calculation circuit 121 may us the following formula to calculate the energy of the digital quadrature amplitude modulation RCC signal to get an energy signal:

$$I^2+Q^2$$

In particular, I is the I channel of the digital quadrature amplitude modulation RCC base band signal, Q is the Q channel of the quadrature amplitude modulation RCC base band signal. The threshold detection circuit 122 may be configured to obtain a threshold from the energy signal. The decision circuit 123 may be configured to compare the energy signal based on the threshold and to generate a RCC signal based on the comparison. In one embodiment, when the energy signal is greater than the threshold, the decision circuit 123 may output the data 1, when the energy signal is less than or equal to the threshold, the decision circuit 123 may output data 0.

In one embodiment, the threshold of the discrete signal may be obtained based on the maximum value of the energy signal within a scheduled time window. In one embodiment, the maximum value minus 3 dB may be the threshold; in one embodiment, the threshold may be the average value of the energy signal within a scheduled time window. The scheduled time window may be selected according to the actual circumstances, for example: 0.5 seconds, 1 second or 2 seconds, and so on.

In the demodulation circuit 12, the quadrature signal energy calculation circuit 121 may be configured to obtain the energy signal, then the narrow band filter 124 may be configured to further suppress out-of-band noise. The threshold detection circuit 122 may be configured to detect the threshold for the energy signal, then the decision circuit 123 may be configured to compare the energy signal based on the threshold to generate a RCC signal. The decision circuit 123 may be configured to output the RCC signal to an external MCU, the MCU may be configured to decode the RCC signal according to a time coding agreement to obtain time information.

Moreover, in this embodiment, the threshold detection circuit 122 may include a time window counter 1221, a maximum value detection circuit 1222 and a threshold calculation circuit 1223. The time window counter 1221 may be configured to connect with the narrow-band filter 124; the maximum value circuit 1222 may be configured to connect with the time window counter 1221; one end of the threshold calculation circuit 1223 may be configured to connect with the maximum value detection circuit 1222 and the other end may be configured to connect with the decision circuit 123.

The time window counter 1221 may be configured to set a scheduled time window. The maximum value detection circuit 1222 may be configured to obtain a maximum value of the energy signal within a scheduled time window for each discrete signal of the energy signal. The threshold calculation circuit 1223 may be configured to obtain the discrete signal threshold based on the maximum value. In one embodiment, the threshold calculation circuit 1223 may use the maximum value minus 3 dB as the threshold.

Moreover, in this embodiment, the receiving circuit 11 and the demodulation circuit 12 may be integrated on one chip.

In this embodiment, the receiving circuit 11 may be configured to process the received analog AM RCC signal to generate a digital AM RCC signal, the demodulation circuit 12 may be configured to demodulate the digital AM RCC signal to generate a RCC signal, resulting in obtaining the RCC signal based on a digital signal processing method. Because the digital signal processing method is more reliable than the analog processing method, the reliabilities of RCC signal reception and demodulation is improved.

Figure 3:
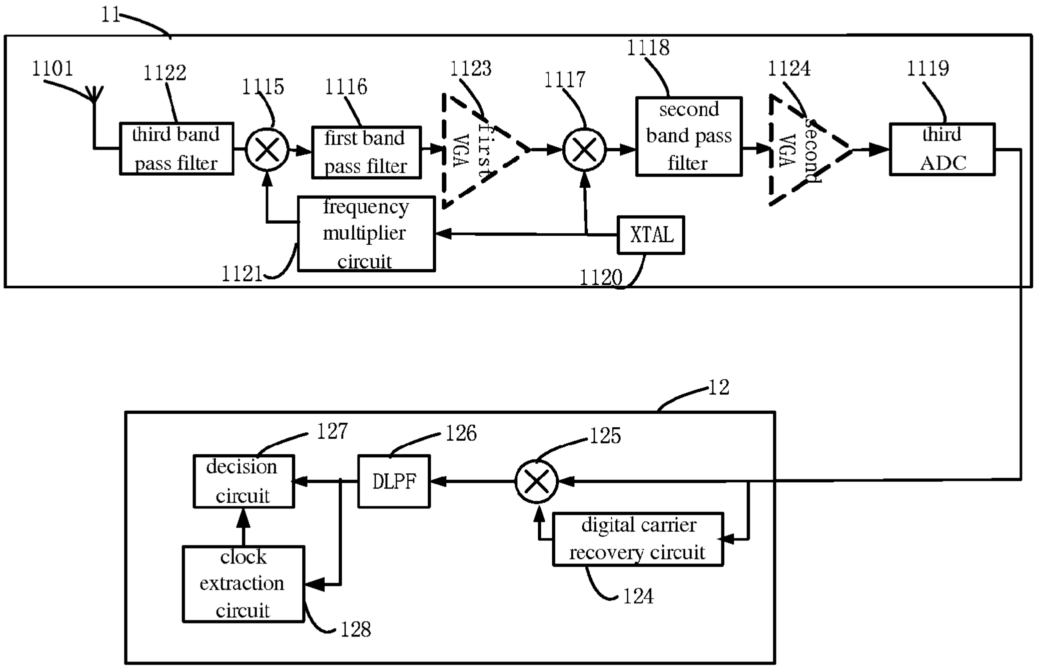
FIG. 3 is a structure diagram showing a device configured to obtain a RCC signal according to a third embodiment.

FIG. 3 is a structure diagram showing a device according to a third embodiment, based on the structure diagram as illustrated in FIG. 1, the receiving circuit 11 may include an antenna 1101, a first analog mixer 1115, a first band pass filter 1116, a second analog mixer 1117, a second band pass filter 1118, a third analog-to-digital converter 1119, an external crystal oscillator (XTAL) 1120 and a frequency multiplier circuit 1121.

In particular, the first analog mixer 1115 may be configured to connect with the antenna 1101 and the frequency multiplier circuit 1121, the frequency multiplier circuit 1121 may be configured to connect with the XTAL 1120. The first band pass filter 1116 may be configured to connect with the first analog mixer 1115, the second analog mixer 1117 may be configured to connect with the first band pass filter 1116 and the XTAL 1120, the second band pass filter 1118 may be configured to connect with the second analog mixer 1117, the third analog-to-digital converter 1119 may be configured to connect with the second band pass filter 1118.

In one embodiment, in order to improve the performance of the receiving circuit 11, the receiving circuit 11 may further include a third band pass filter 1122, a first variable gain amplifier (VGA) 1123 and a second VGA 1124. In particular, the third band pass filter 1122 may be configured to connect between the antenna 1101 and the first analog mixer 1115, the first VGA 1123 may be configured to connect between the first band pass filter 1116 and the second analog mixer 1117, the second VGA 1124 may be configured to connect between the second band pass filter 1118 and the third analog to digital converter 1119

Furthermore, in this embodiment, the demodulation circuit 12 may include a digital carrier recovery circuit 124, a digital mixer 125, a digital low-pass filter 126, a decision circuit 127 and a clock extraction circuit 128. The digital carrier recovery circuit 124 may be configured to connect with the receiving circuit 11, the digital mixer 125 may be configured to connect with the receiving circuit 11 and the digital carrier recovery circuit 124, the digital low-pass filter 126 may be configured to connect with the digital mixer 125, the clock extraction circuit 128 may be configured to connect with the low pass filter 126, the decision circuit 127 may be configured to connect with the digital low pass filter 126 and the clock extraction circuit 128.

In the receiving circuit 11, the antenna 1101 may be configured to receive an analog AM RCC signal. The analog AM RCC signal may pass through the third band pass filter 1122 to filter out-of-band noise. The XTAL 1120 may be configured to generate a local oscillator signal, and the local oscillator signal may provide a reference clock for the frequency multiplier circuit 1121 at the same time, the frequency multiplier circuit 1121 may be configured to output a signal to the first analog mixer 1115. The first analog mixer 1115 may be configured to mix the radio frequency signal coming from the third band pass filter 1122 with the signal coming from the multiplier circuit 1121, and to generate an analog signal. The analog signal may pass through the first band pass filter 207 to generate a first analog IF signal, the first analog IF signal may pass through the first variable gain amplifier 1123 and be sent to the second analog mixer 1117. The second mixer 1117 may be configured to receive the first analog intermediate frequency signal and the local oscillator signal transmitted by the XTAL 1120 for mixing, and then output the mixed signal to the second band pass filter 1118, the mixed signal may pass through the second band pass filter 1118 to generate a second analog IF signal, the second analog IF signal may pass through the second variable gain amplifier 1124 for amplification and be sent to the third analog-to-digital converter 1119 to generate a digital IF signal, the digital IF signal may be sent to the demodulation circuit 12 for demodulation.

In the demodulation circuit 12, the digital IF signal may pass through the digital carrier recovery circuit 124 to generate a carrier signal, the digital mixer 125 may be configured to receive the digital IF signal and the carrier signal for mixing, and to output the mixed signal to the digital low pass filter 126, the mixed signal may pass through the digital low pass filter 126 to generate a digital base band signal, the digital base band signal may be sent to the decision circuit 127 and the clock extraction circuit 128, the clock extraction circuit 128 may be configured to extract a clock signal from the digital base band signal and to send the clock signal to the decision circuit 127, the decision circuit 127 may be configured to use the clock signal to sample the digital base band signal, then to judge the sampled signal, and to output a RCC signal. In one embodiment, when the sampled signal is greater than 0, the decision circuit 128 may output data 1, when the sampled signal is less than or equal to 0, the decision circuit 128 may output data 0. The decision circuit 127 may be configured to output the RCC signal to the external MCU, the external MCU may be configured to decode the RCC signal according to a time coding agreement to obtain time information.

In one embodiment, the receiving circuit 11 may only include the antenna 1101, the first analog mixer 1115, the first band pass filter 1116, the third analog-to-digital converter 1119 and an external crystal oscillator 1120.

In one embodiment, the receiving circuit 11 may include an antenna, at least one local oscillator circuit, at least one mixing circuit in cascade connection, at least one band pass filter and at least one analog to digital converter. At least one mixing circuit may be configured to connect with the antenna and at least one local oscillator circuit; each of the mixing circuit's output may be configured to connect with a band pass filter; input or output of any mixing circuit may be configured to connect with an analog to digital converter.

In this embodiment, the receiving circuit 11 may be configured to process the received analog AM RCC signal to generate a digital AM RCC signal, the demodulation circuit 12 may be configured to demodulate the digital AM RCC signal to generate a RCC signal, resulting in obtaining the RCC signal based on a digital signal processing method. Because the digital signal processing method is more reliable than the analog processing method, the reliability of RCC signal reception and demodulation is improved.

Figure 4:
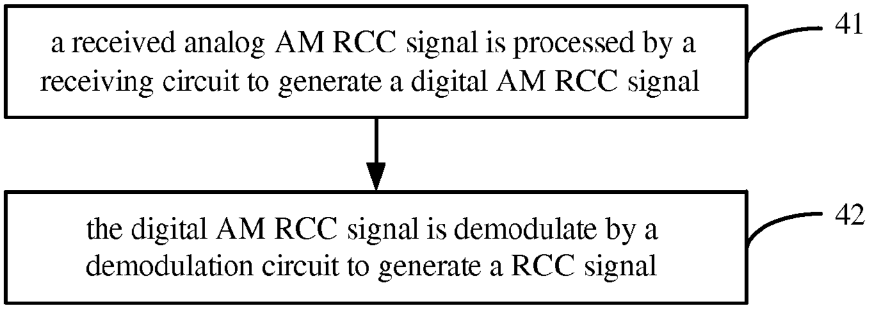
FIG. 4 is a flow chart showing a method for obtaining a RCC signal according to the first embodiment.

FIG. 4 is a flow chart showing a method for obtaining a RCC signal according to the first embodiment and the method may include the following steps:

In step 41, a received analog AM RCC signal is processed by a receiving circuit to generate a digital AM RCC signal;

In step 42, the digital AM RCC signal is demodulate by a demodulation circuit to generate a RCC signal.

In this embodiment, the receiving circuit 11 may process the received analog AM RCC signal to generate a digital AM RCC signal, the demodulation circuit 12 may demodulate the digital AM RCC signal to generate a RCC signal, resulting in obtaining the RCC signal based on a digital signal processing method. Because the digital signal processing method is more reliable than the analog processing method, the reliability of RCC signal reception and demodulation is improved.

Figure 5:
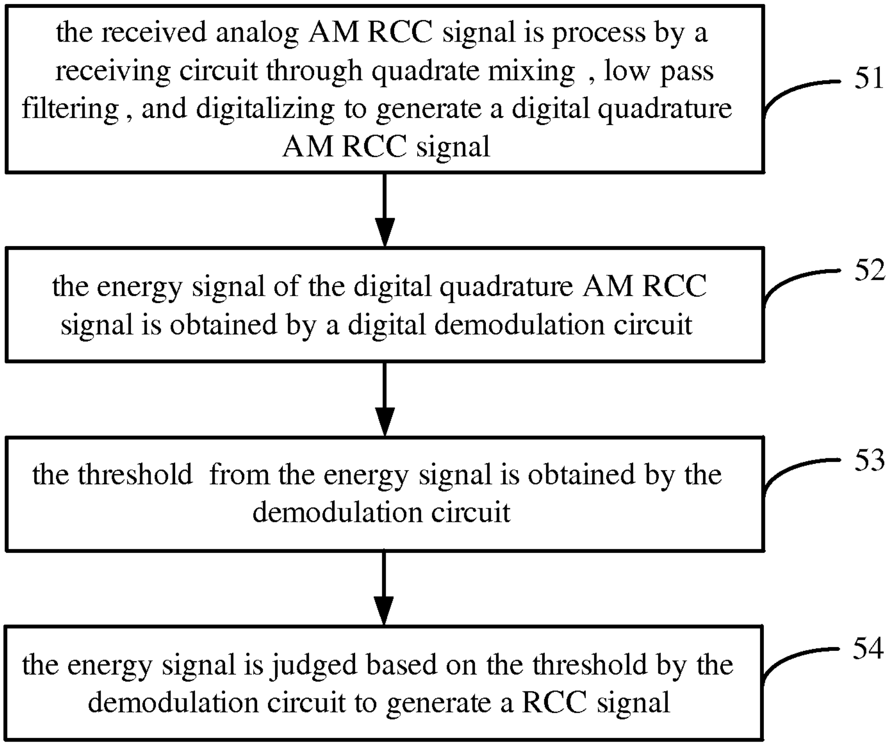
FIG. 5 is a flow chart showing a method for obtaining a RCC signal according to the second embodiment.

FIG. 5 is a flow chart showing a method for obtaining a RCC signal according to the second embodiment, on the basis of the flow chart as illustrated in FIG. 4, the step 41 may include the following steps:

In step 51, the received analog AM RCC signal is process by a receiving circuit through quadrature mixing, low pass filtering, and digitalizing to generate a digital quadrature AM RCC signal;

Specifically, the receiving circuit may process the analog AM RCC signal through analog quadrature mixing and low pass filtering, and then digitalize the analog AM RCC signal; the receiving circuit may also digitalize the analog AM RCC signal and then process the analog AM RCC signal through digital quadrature mixing and low pass filtering; the receiving circuit may also process the analog AM RCC signal through analog quadrature mixing and low pass filtering, and digitalize the analog AM RCC signal, then process the AM RCC signal through digital quadrature mixing and low pass filtering.

On the basis of the flow chart as illustrated in FIG. 4, the step 42 may include the following steps:

In step 52, the energy signal of the digital quadrature AM RCC signal is obtained by a digital demodulation circuit;

Specifically, the demodulation circuit may obtain the energy signal of the digital quadrature AM RCC signal according to the following formula:

$$I^2+Q^2$$

In particular, I is the I channel of the digital quadrature AM RCC signal, Q is the Q channel of the digital quadrature AM RCC signal.

In step 53, the threshold from the energy signal is obtained by the demodulation circuit;

Specifically, the demodulation circuit may obtain the maximum value of the energy signal within a scheduled time window, and obtain the threshold based on the maximum value. For example, the maximum value minus 3 dB may be the threshold. In one embodiment, the demodulation circuit may obtain the average value of the energy signal within a scheduled time window as the threshold.

In step 54, the energy signal is judged based on the threshold by the demodulation circuit to generate a RCC signal;

In one embodiment, when the energy signal is greater than the threshold, the demodulation circuit may output data 1, when the energy signal is less than or equal to the threshold, the demodulation circuit may output data 0.

In this embodiment, the receiving circuit 11 may process the received analog AM RCC signal to generate a digital AM RCC signal, the demodulation circuit 12 may demodulate the digital AM RCC signal to generate a RCC signal, resulting in obtaining the RCC signal based on a digital signal processing method. Because the digital signal processing method is more reliable than the analog processing method, the reliability of RCC signal reception and demodulation is improved.

Figure 6:
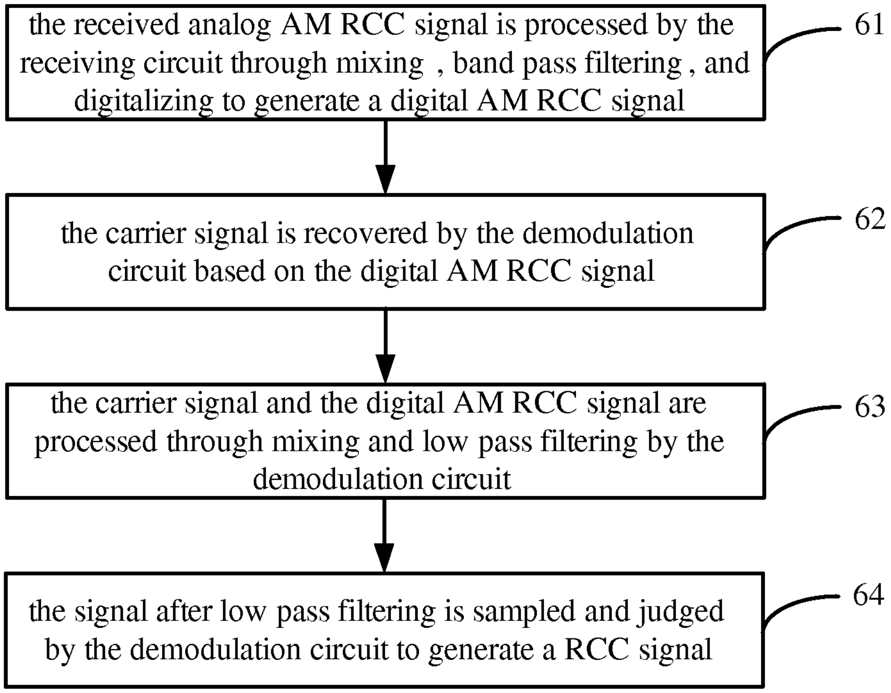
FIG. 6 is a flow chart showing a method for obtaining a RCC signal according to the third embodiment.

FIG. 6 is a flow chart showing a method for obtaining a RCC signal according to the third embodiment, on the basis of the flow chart as illustrated in FIG. 4, the step 41 may include the following steps:

In step 61, the received analog AM RCC signal is processed by the receiving circuit through mixing, band pass filtering, and digitalizing to generate a digital AM RCC signal;

Specifically, the receiving circuit may process the analog AM RCC signal through mixing and low pass filtering, and then digitalize the analog AM RCC signal; the receiving circuit may also digitalize the analog AM RCC signal and then process the analog AM RCC signal through quadrature mixing and low pass filtering; the receiving circuit may also process the analog AM RCC signal through mixing and low pass filtering, then digitalize the analog AM RCC signal, and process the analog AM RCC signal through mixing and low pass filtering.

On the basis of the flow chart as illustrated in FIG. 4, the step 42 may include the following steps:

In step 62, the carrier signal is recovered by the demodulation circuit based on the digital AM RCC signal;

In step 63, the carrier signal and the digital AM RCC signal are processed through mixing and low pass filtering by the demodulation circuit;

In step 64, the signal after low pass filtering is sampled and judged by the demodulation circuit to generate a RCC signal.

In one embodiment, when the signal after sampling is greater than 0, the demodulation circuit may output data 1, when the signal after sampling is less than or equal to 0, the demodulation circuit may output data 0.

In this embodiment, the receiving circuit 11 may process the received analog AM RCC signal to generate a digital AM RCC signal, the demodulation circuit 12 may demodulate the digital AM RCC signal to generate a RCC signal, resulting in obtaining the RCC signal based on a digital signal processing method. Because the digital signal processing method is more reliable than the analog processing method, the RCC signal reception and demodulation reliabilities are improved.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A device configured to obtain a Radio Controlled Clock (RCC) signal comprises:

a receiving circuit configured to receive an analog AM RCC signal and to process said analog AM radio RCC signal to generate a digital AM RCC signal;

a demodulation circuit configured to be in connection with said receiving circuit to demodulate said digital AM RCC signal to generate said RCC signal;

wherein the receiving circuit includes:

an antenna;

an analog quadrature mixing circuit configured to connect with the antenna, wherein said output of the analog quadrature mixing circuit including a first output branch and a second output branch;

a quadrature local oscillator circuit configured to connect with said analog quadrature mixing circuit;

a first analog low-pass filter configured to connect with said first output branch;

a second analog low pass filter configured to connected with said second output branch;

a first analog to digital converter configured to connect with said first analog low-pass filter; a second analog to digital converter configured to connect with said second analog low-pass filter;

a digital quadrature mixing circuit configured to connect with said first analog to digital converter and said second analog-to digital-converter, wherein the output of said digital quadrature mixing circuit including a third output branch and a fourth output branch;

a quadrature digital local oscillator circuit configured to connect with said digital quadrature mixing circuit;

a first digital low pass filter configured to connect with said third output branch at one end and to connect with said demodulation circuit at the other end;

a second digital low pass filter configured to connect with said fourth output branch at one end and to connect with said demodulation circuit at the other end.

2. A device according to claim 1, wherein the demodulation circuit includes:

a quadrature signal energy calculation circuit configured to connect with said receiving circuit and to obtain a energy signal for the digital AM RCC signal according to the formula: $I^2+Q^2$, wherein I is the I channel of the digital quadrature AM RCC signal, Q is the Q channel of the digital quadrature AM RCC signal;

a threshold detection circuit configured to connect with said quadrature signal energy calculation circuit and to obtain a threshold from the energy signal;

a decision circuit configured to connect with said threshold detection circuit and said quadrature signal energy calculation circuit, and to judge said energy signal based on said threshold to obtain said RCC signal.

3. The device according to claim 2, wherein said threshold detection circuit including:

a time window counter configured to connect with said quadrature signal energy calculation circuit, and to set a scheduled time window;

a maximum value detection circuit configured to connect with said time window counter, and to obtain the maximum value of the energy signal within the scheduled time window;

a threshold calculation circuit configured to connect with said maximum value detection circuit at one end and said decision circuit at the other end, and to obtain the threshold based on the maximum value.

4. The device according to claim 2, wherein said receiving circuit and said demodulation circuit are integrated on a single chip.

* * * * *